United States Patent
Yanagita

(10) Patent No.: US 8,912,774 B2
(45) Date of Patent: Dec. 16, 2014

(54) SOFT-SWITCHING CONTROL DEVICE AND METHOD OF MANUFACTURING THE SAME

(75) Inventor: Yukihiro Yanagita, Kariya (JP)

(73) Assignee: Denso Corporation, Kariya (JP)

( * ) Notice: Subject to any disclaimer, the term of this patent is extended or adjusted under 35 U.S.C. 154(b) by 617 days.

(21) Appl. No.: 13/180,798

(22) Filed: Jul. 12, 2011

(65) Prior Publication Data
US 2012/0020120 A1 Jan. 26, 2012

(30) Foreign Application Priority Data
Jul. 12, 2010 (JP) ................................. 2010-157942

(51) Int. Cl.
H02M 3/158 (2006.01)
H03K 17/16 (2006.01)
H02M 1/34 (2007.01)
H03K 5/00 (2006.01)

(52) U.S. Cl.
CPC .......... *H02M 1/34* (2013.01); H02M 2001/342 (2013.01); Y02B 70/1491 (2013.01); *H03K 17/163* (2013.01); H03K 2005/00058 (2013.01)
USPC ............................. 323/271; 323/222; 323/282

(58) Field of Classification Search
USPC ........... 323/222, 282, 271; 363/21.03, 50, 52, 363/56.04, 89
See application file for complete search history.

(56) References Cited

U.S. PATENT DOCUMENTS

| | | | |
|---|---|---|---|
| 7,075,801 B2 * | 7/2006 | Aso | 363/21.01 |
| 7,869,228 B2 * | 1/2011 | Qahouq et al. | 363/21.01 |
| 7,965,522 B1 * | 6/2011 | Hornberger et al. | 363/21.1 |
| 2002/0175661 A1 * | 11/2002 | Wheeler et al. | 323/282 |
| 2005/0265058 A1 * | 12/2005 | Stevanovic et al. | 363/131 |
| 2007/0018618 A1 * | 1/2007 | Endo | 323/224 |
| 2008/0278130 A1 * | 11/2008 | Ito | 323/282 |

(Continued)

FOREIGN PATENT DOCUMENTS

| | | |
|---|---|---|
| CN | 102948059 | 2/2013 |
| JP | 2001-119926 | 4/2001 |

(Continued)

OTHER PUBLICATIONS

Virtex-II Platform FPGA User Guide (UG002 v2.0). Xilinx, Inc. Mar. 23, 2005. Obtained from http://www-mtl.mit.edu/Courses/6.111/labkit/datasheets/virtex2userguide.pdf on Jan. 8, 2014.*

(Continued)

*Primary Examiner* — Fred E Finch, III
(74) *Attorney, Agent, or Firm* — Nixon & Vanderhye PC

(57) ABSTRACT

Soft-switching is performed to switch a switching state to an ON state by controlling a delay time of a timing at which a main switch switches to an ON state relative to a timing at which a sub-switch switches to an ON state. Controllability of soft-switching decreases as a result of variations in time difference of a command for switching the main switch to the ON state and the actual switching of the switching state. To set a delay time suitable for performing soft-switching based on the variations in time difference, an EEPROM is provided that stores therein correction data for the delay time. The delay time of the timing of the command for switching the main switch to the ON state relative to the timing of the command for switching the sub-switch to the ON state is set based on the correction data.

18 Claims, 15 Drawing Sheets

(56) References Cited

U.S. PATENT DOCUMENTS

| | | | |
|---|---|---|---|
| 2010/0109626 A1* | 5/2010 | Chen | 323/282 |
| 2010/0124086 A1* | 5/2010 | Chen | 363/127 |
| 2012/0105034 A1* | 5/2012 | Brown et al. | 323/282 |
| 2012/0326687 A1* | 12/2012 | Hasegawa et al. | 323/283 |
| 2013/0119968 A1* | 5/2013 | Manabe et al. | 323/318 |

FOREIGN PATENT DOCUMENTS

| | | | |
|---|---|---|---|
| JP | P2007-116846 A | 5/2007 | |
| JP | 2008-283815 | 11/2008 | |
| JP | P2009-165245 A | 7/2009 | |

OTHER PUBLICATIONS

Office Action (7 pages), dated Sep. 27, 2013, issued in corresponding Chinese Application No. 201110199662.2 and English translation (11 pages).

Japanese Office Action dated Apr. 17, 2012, issued in corresponding Japanese Application No. 2010-157942, with English translation.

* cited by examiner (DETECTION STEP)

⇩

(STORAGE STEP)

(DETECTION STEP)

⇓

(STORAGE STEP)

(DETECTION STEP)

(STORAGE STEP)

(DETECTION STEP)

(STORAGE STEP)

(DETECTION STEP)

⇩

(STORAGE STEP)

| TEMPERATURE | LOW | | | ⟶ | HIGH |
|---|---|---|---|---|---|
| CORRECTION DATA | | | ... | | |

(DETECTION STEP)

(STORAGE STEP)

(DETECTION STEP)

⇩

(STORAGE STEP)

(DETECTION STEP)

(STORAGE STEP)

SOFT-SWITCHING CONTROL DEVICE AND METHOD OF MANUFACTURING THE SAME

CROSS-REFERENCE TO RELATED APPLICATION

This application is based on and claims the benefit of priority from earlier Japanese Patent Application No. 2010-157942 filed Jul. 12, 2010 the description of which is incorporated herein by reference.

BACKGROUND OF THE INVENTION

1. Field of the Invention

The present invention relates to a soft-switching control device that operates a switching element configuring a power conversion circuit and a method of manufacturing the soft-switching control device. In the soft-switching control device, soft-switching is performed to switch the state of the switching element by controlling a delay time of a timing at which the switching state is switched in relation to a reference timing.

2. Description of the Related Art

As a power conversion circuit enabling soft-switching, a power conversion circuit is proposed (JP-A-2008-283815, and "Research on soft-switching circuit system for power converters in the field of next-generation clean energy applications", available at the www site: kawalab.dnj.ynu.ac.jp/research/power_electronics/Chopper/Chopper1.html in which a capacitor is connected in parallel with a main switching element of a boost chopper circuit, and an auxiliary switching element, an auxiliary inductor, and the like are provided. Specifically, a delay time of a timing at which the main switching element is switched to an ON-state in relation to a timing at which the auxiliary switching element is switched to an ON-state is controlled. As a result, the main switching element is switched to the ON-state at a timing at which the electrical charge of the capacitor connected in parallel with the main switching element becomes zero. Thus, switching to the ON-state is performed by zero-voltage switching (ZVS).

However, when above-described soft-switching is performed, the delay time is required to be controlled with high accuracy. Therefore, soft-switching may not be able to be appropriately performed when deviation attributed to individual differences and the like occurs between the timings at which ON operation commands for the auxiliary switching element and the main switching element are given and the timings at which the auxiliary switching element and the main switching element are actually switched to the ON-state. The inventors and others have found that such instances actually occur as a result of use of a drive system of a power conversion circuit that performs conventional hard-switching.

In the power conversion circuit that performs conventional hard-switching, delay time adjustment is only required to set a dead time for turning OFF both of a pair of switching elements driven complementarily. The dead time is merely required to be set to prevent with certainty a period where both switching elements are in an ON-state. Therefore, a sufficient margin is ordinarily provided. The effects that setting such margins have on control can be compensated with relative ease by correcting operation signals of the switching elements, such as in a known dead time compensation technique. Conversely, because the effect of soft-switching decreases regardless of the length of the delay time, a method in which a margin is set as described above cannot be used.

The above-described circumstances where soft-switching may not be able to be appropriately performed are not limited to the power conversion circuit, and are generally common in instances where soft-switching is performed to switch the switching state of the switching element by controlling the delay time of the timing at which the switching state is switched relative to the reference timing.

SUMMARY

Hence, it is desired to provide a soft-switching drive circuit and a method of manufacturing the soft-switching drive circuit, in which soft-switching is performed to switch a switching state of a switching element by controlling a delay time of a timing at which the switching state is switched relative to a reference timing. It is also desired that the circuit and the method are capable of favorably suppressing decrease in controllability of soft-switching caused by variation in time difference between a command for switching the switching state and an actual switching of the switching state.

As one of exemplary embodiments, there is provided a soft-switching control device that operates a switching element configuring a power conversion circuit, in which soft-switching is performed to switch a switching state of the switching element by controlling a delay time of a timing at which the switching state is switched in relation to a reference timing, the soft-switching control device comprising: a storage means for storing correction information of a timing of a command for switching the switching state of the switching element configuring the power conversion circuit, the correction information being used to reduce error in the delay time; and a correcting means for correcting a timing at which the switching state of the switching element is switched based on the correction information.

In the above-described configuration, soft-switching controllability is highly maintained by switching the switching state using correction information for reducing error in delay time attributed to variations in a transmission path for switching-state switching-command signals and circuit characteristics of the power conversion circuit.

The configurations and advantages will be clear from the description set forth below together with the accompanying drawings.

DETAILED DESCRIPTION OF THE PREFERRED EMBODIMENTS

First Embodiment

A first embodiment will be described with reference to the drawings. According to the first embodiment, a soft-switching control device of the present invention is applied to a power conversion circuit that exchanges power with a vehicle main engine.

Figure 1:
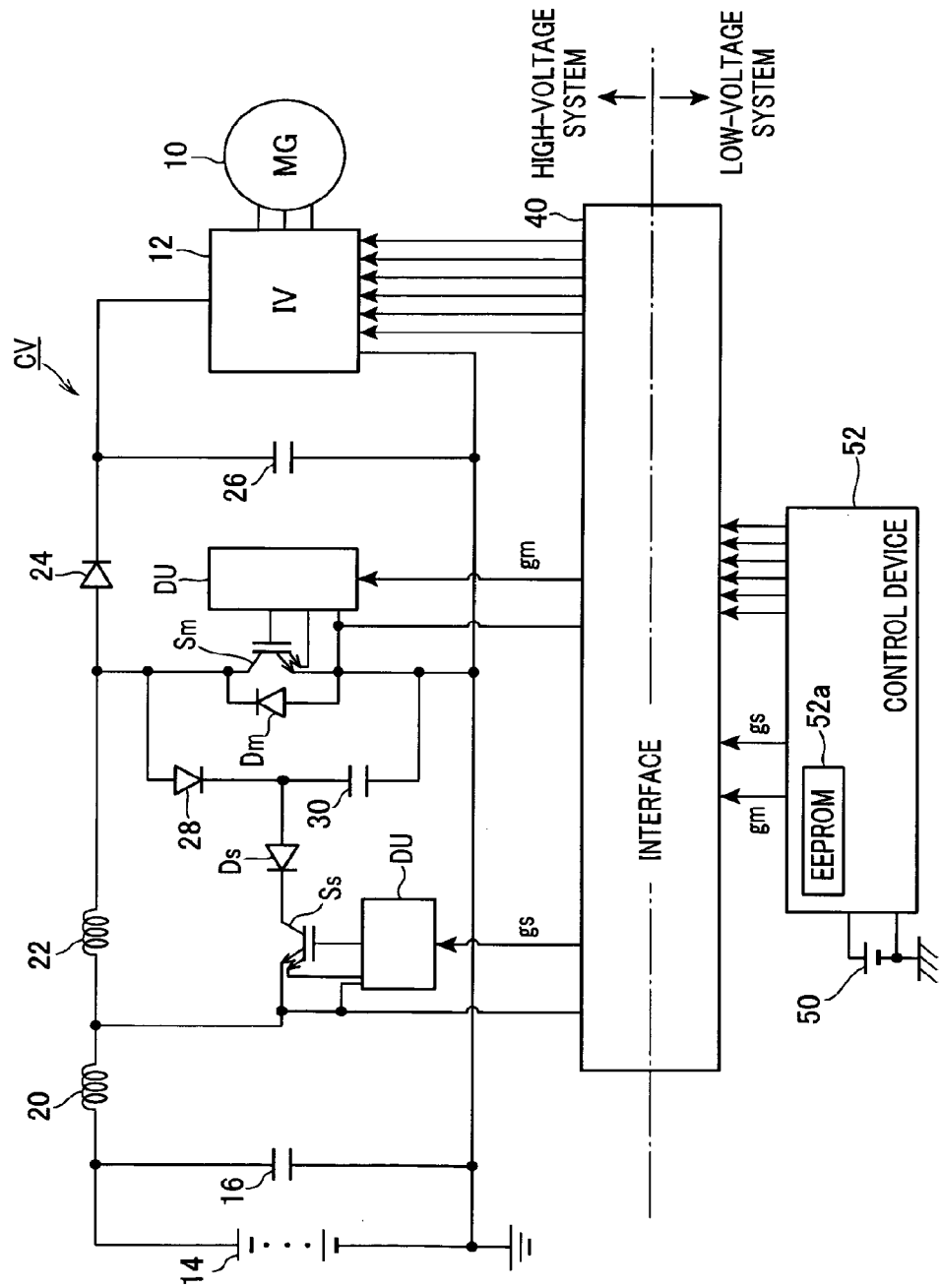
FIG. 1 is a system configuration diagram according to a first embodiment.

FIG. 1 shows a system configuration according to the first embodiment.

A motor generator 10 shown in FIG. 1 is a vehicle main engine. A rotation shaft (rotor) of the motor generator 10 is mechanically connected to driving wheels. The motor generator 10 is connected to a high-voltage battery 14 and a capacitor 16 with an inverter 12 and a converter CV therebetween. Here, the high-voltage battery 14 is a high-voltage secondary battery having a terminal voltage of 100V or more.

The converter CV is basically a known boost chopper circuit that stores power from the high-voltage battery 14 in inductors 20 and 22 as a result of a main switch Sm being turned ON. The converter CV outputs the energy stored in the inductors 20 and 22 to an output terminal side (capacitor 26) via a diode 24 as a result of the main switch Sm being turned OFF. However, according to the first embodiment, because the main switch Sm is an insulated-gate bipolar transistor (IGBT), a diode Dm is connected in reverse parallel with the main switch Sm. To enable regeneration of power to the high-voltage battery 14, the boost chopper circuit is preferably configured such that a switching element is also connected in parallel with the diode 24. However, this is not directly related to the following description, and therefore, description thereof is omitted.

In addition to the boost chopper circuit, the converter CV includes an auxiliary circuit for performing soft-switching. In other words, a serially-connected body of a diode 28 and a capacitor 30 is connected in parallel with the main switch Sm. An input terminal of an IGBT (sub-switch Ss) is connected to a connection point (cathode of the diode 28) between the diode 28 and the capacitor 30, with a diode Ds therebetween.

An output terminal of the sub-switch Ss is connected to a connection point between the inductors 20 and 22.

A drive unit DU is connected to the gates of the main switch Sm and the sub-switch Ss. The drive unit DU operates the gate voltage of the switching element to be driven, thereby driving the switching element.

The motor generator 10, the inverter 12, the converter CV, the high-voltage battery 14, and the like configure a vehicle high-voltage system that is insulated from a vehicle low-voltage system. On the other hand, the vehicle low voltage system includes a control device 52. The control device 52 uses a low-voltage battery 50 having a lower terminal voltage (such as by several volts to several tens of volts) than the high-voltage battery 14 as a power source. The control device 52 operates the inverter 12 and the converter CV to control a control amount of the motor generator 10. Specifically, the control device 52 controls the output voltage of the converter CV to achieve a voltage suitable for controlling the control amount of the motor generator 10. To control the output voltage, the control device 52 generates an operation signal gm of the main switch Sm and an operation signal gs of the sub-switch Ss, and outputs the operations signals gm and gs to the drive unit DU via an interface 40. The drive unit DU operates the main switch Sm and the sub-switch Ss based on the operation signals gm and gs.

The interface 40 basically insulates the low-voltage system and the high-voltage system.

Figure 2:
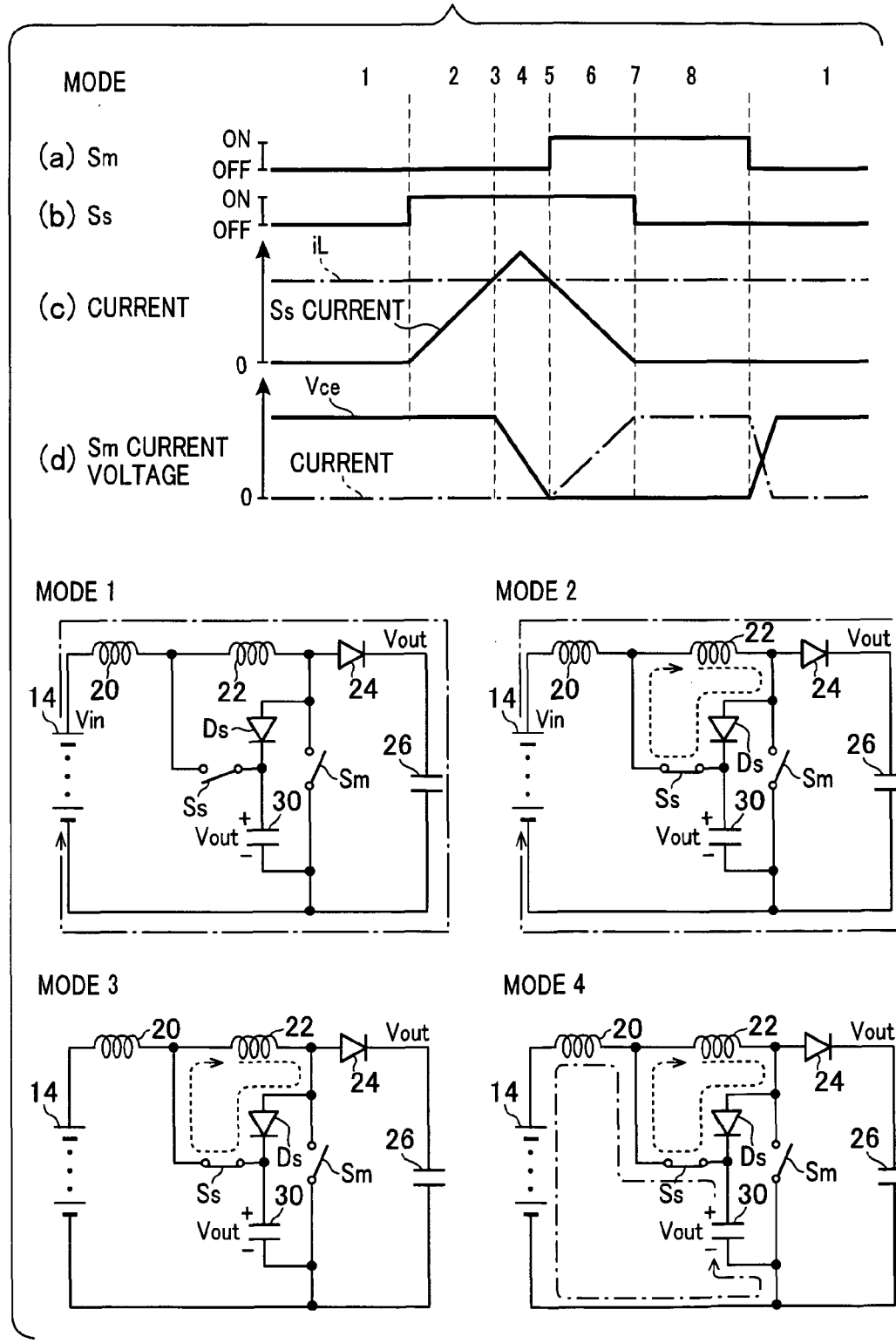
FIG. 2 is a time chart showing a soft-switching process according to the first embodiment.
Figure 3:
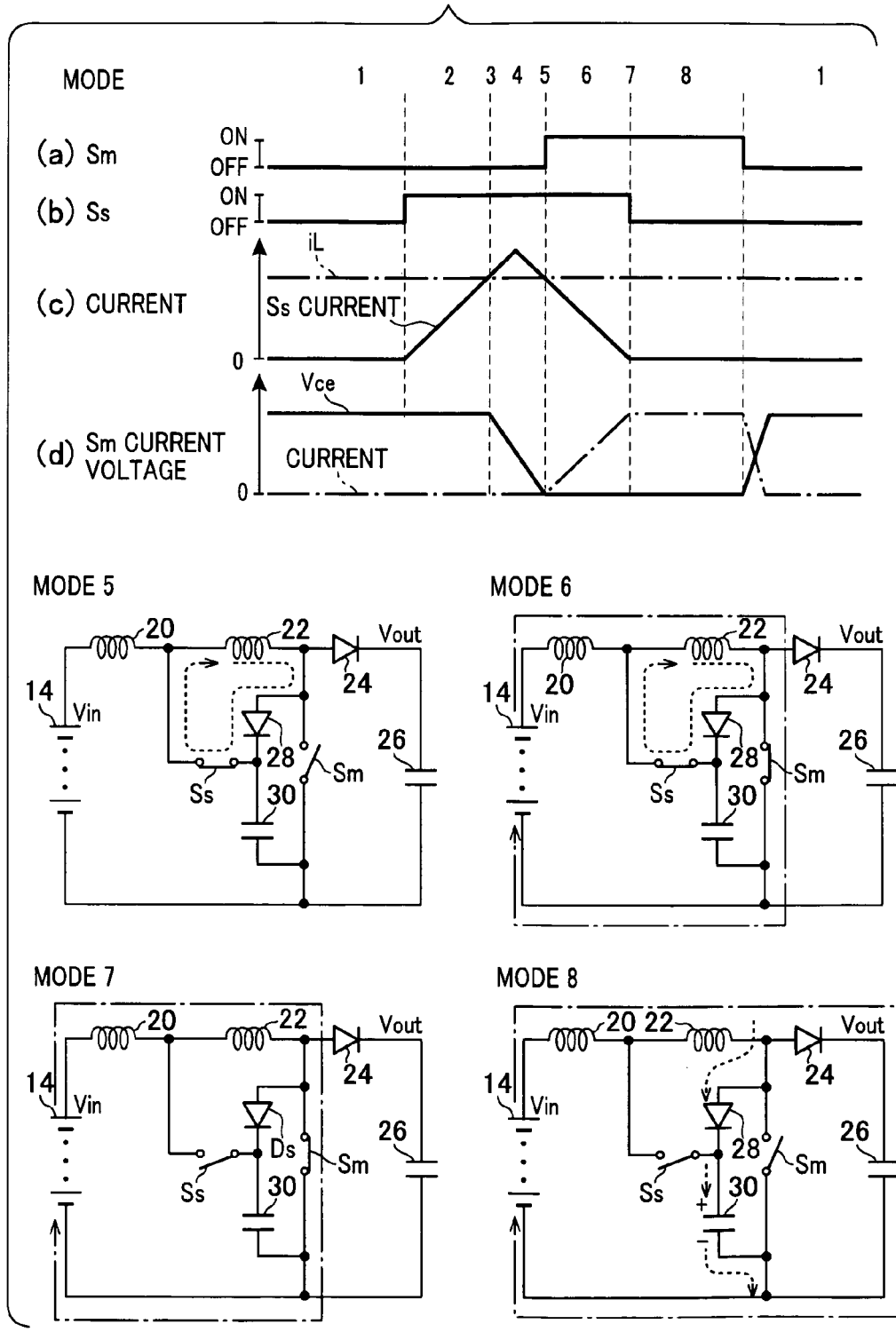
FIG. 3 is a time chart showing the soft-switching process according to the first embodiment.

Next, soft-switching control according to the first embodiment will be described with reference to FIG. 2 and FIG. 3. Here, both time charts shown in FIG. 2 and FIG. 3 are the same. FIG. 2 shows current flow and the like in mode 1 to mode 4 indicated above the time chart. FIG. 3 shows current flow and the like in mode 5 to mode 8 indicated above the time chart. In the time chart, (a) indicates the state of the main switch Sm, (b) indicates the state of the sub-switch Ss, (c) indicates the transition of a current iL of the inductor 22 and a current flowing through the sub-switch Ss, and (d) indicates a transition of voltage between the input and output terminals (collector-emitter voltage Vice) of the main switch Sm and a current flowing through the main switch Sm. Mode 1 to mode 8 will hereinafter be described in sequence.

[Mode 1]

The main switch Sm and the sub-switch Ss are both in an OFF state. The current from the high-voltage battery 14 flows into the capacitor 26 via the inductors 20 and 22, and the diode 24. Here, the current flowing through the inductors 20 and 22 gradually decrease at a speed proportional to the difference between input voltage Vin that is the terminal voltage of the high-voltage battery 14 and output voltage Vout of the converter CV. Because a charge voltage of the capacitor 30 is equivalent to the output voltage Vout, the diode Ds is in an OFF state.

[Mode 2]

The sub-switch Ss is switched to the ON state while the main switch Sm remains in the OFF state. As a result, the connection point between the inductor 20 and the inductor 22 is short-circuited with the positive electrode of the capacitor 30. The voltage at the connection point becomes equivalent to the output voltage Vout. Therefore, the voltage is no longer applied to both ends of the inductor 22, and the current that had been flowing during the switch to mode 2 continues to flow through the inductor 22. On the other hand, an absolute value of the voltage applied to both ends of the inductor 20 increases to the difference between of input voltage Vin and output voltage Vout. As a result, the speed of gradual decrease of the current flowing through the inductor 20 increases. The amount of reduction in the current flowing through the inductor 20 is the amount of increase in the current flowing through the sub-switch Ss. As a result, the current flows through a loop circuit including the sub-switch Ss, the inductor 22, and the diode Ds, and the current gradually increases. After the sub-switch Ss is switched to the ON state, the current increases in proportion to a value obtained by the difference of input voltage Vin and output voltage Vout divided by the inductance of the inductor 20. Therefore, the current flowing through the loop circuit when the sub-switch Ss is switched to the ON state is basically zero. Thus, switching of the sub-switch Ss to the ON state is zero current switching (ZCS).

[Mode 3]

The current flowing through the inductor 20 gradually decreases and becomes zero. At this time, the current outputted via the diode 24 also becomes zero. The current flows through a loop circuit including the inductor 22, the diode Ds, and the sub-switch Ss.

[Mode 4]

Because the charge voltage of the capacitor 30 is higher than the terminal voltage (Vin) of the high-voltage battery 14, the capacitor 30 discharges energy to the high-voltage battery 14 via the inductor 20.

[Mode 5]

The charge of the capacitor 30 becomes zero and the current flowing through the inductor 20 becomes zero. For the charge of the capacitor 30 to become zero, the output voltage Vout is required to increase by a constant multiple of the input voltage Vin. A description of when the increase is less than a constant multiple is omitted herein.

[Mode 6]

The main switch Sm is switched to an ON state. Here, when the charge voltage of the capacitor 30 is zero, the voltage between the input and output terminals of the main switch Sm is zero. Therefore, when the main switch Sm is switched to the ON state at this time, switching to the ON state can be performed by zero voltage switching (ZVS). As a result of the main switch Sm being switched to the ON state, the current flows through a loop circuit including the high-voltage battery 14, the inductors 20 and 22, and the main switch Sm, and energy is collected in the inductors 20 and 22. At this time, the current flowing through the inductor 20 gradually increases, and the current flowing through the sub-switch Ss decreases by an amount of increase in the current flowing through the inductor 20.

[Mode 7]

The current flowing through the sub-switch Ss becomes zero. In accompaniment, the sub-switch Ss is synchronously switched to the OFF state. In this instance, because the current does not flow through the sub-switch Ss, switching to the OFF state is performed by zero current switching (ZCS).

[Mode 8]

The main switch Sm is switched to the OFF state. Here, the voltage between the input and output terminals of the main switch Sm rises as a result of the main switch Sm being switched to the OFF state. However, the rising speed is restricted by the charging speed of the capacitor 30. Therefore, switching of the main switch Sm to an OFF state is performed by zero voltage switching (ZVS). As a result of the main switch Sm being switched to the OFF state and the charge voltage of the capacitor 30 becoming about the same as the output voltage Vout, the current is outputted from the high-voltage battery 14 via the inductors 20 and 22, and the diode 24.

As described above, according to the first embodiment, all switching of the switching states of the main switch Sm and the sub-switch Ss can be performed by soft-switching.

Figure 4:
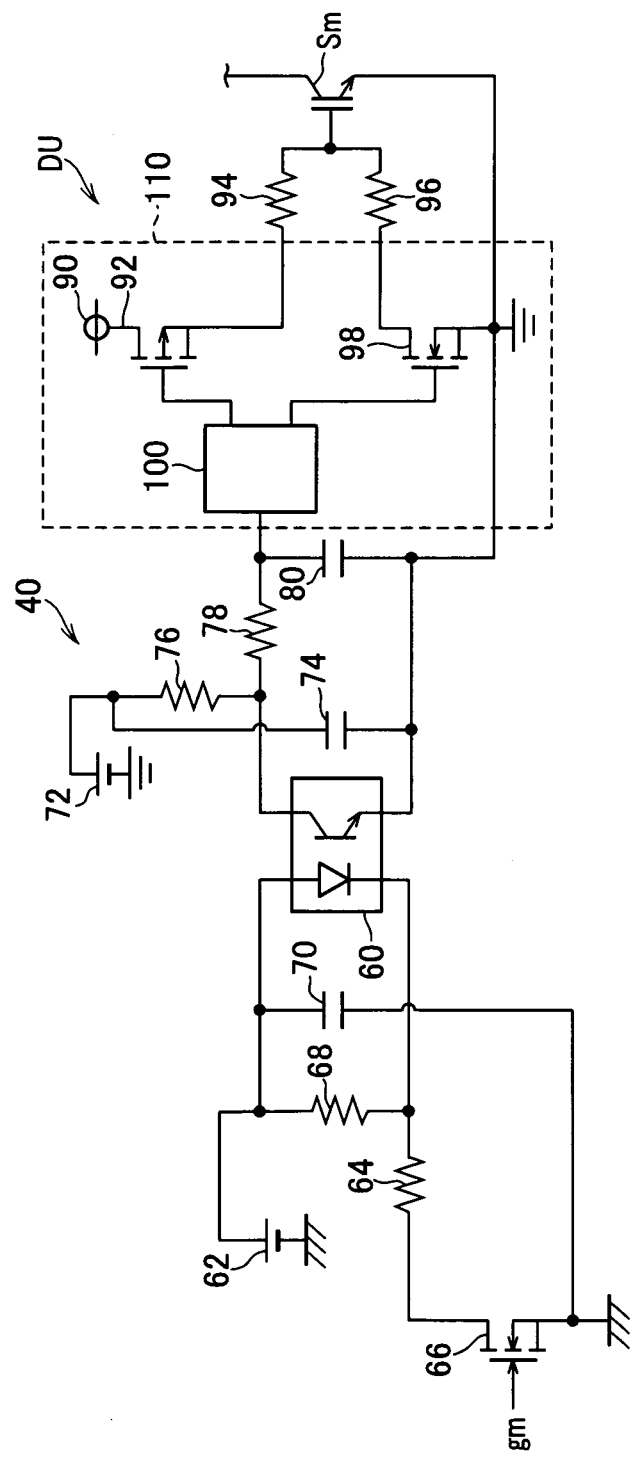
FIG. 4 is a circuit diagram of a circuit configuration of an interface and a drive unit according to the first embodiment.

FIG. 4 shows a circuit configuration of the interface 40 and the drive unit DU related to the main switch Sm. The interface 40 includes a photocoupler 60 serving as an insulating means for transmitting signals from the low-voltage system side to the high-voltage system side. A voltage of a power source 62 is applied to the anode of the photodiode of the photocoupler 60. The cathode of the photodiode is grounded via a resistor 64 and an N-channel metal-oxide-semiconductor (MOS) transistor (low-voltage side switching element 66). The operation signal gm is applied to a conduction control terminal (gate) of the low-voltage side switching element 66. A resistor 68 is connected in parallel to the photodiode. A capacitor 70 is connected in parallel with the photodiode, the resistor 64, and the low-voltage side switching element 66.

Voltage of a power source 72 is applied to an input terminal (collector) of the phototransistor of the photocoupler 60 via a resistor 76. The output terminal (emitter) of the phototransistor is connected to the output terminal (emitter) of the main switch Sm. A capacitor 74 is connected in parallel with the phototransistor and the resistor 76. A resistor 78 and a capacitor 80 are further connected in parallel with the phototransistor.

The charge voltage of the capacitor 80 is inputted into an integrated circuit (drive IC 110) within the drive unit DU as a command signal for the switching state of the main switch Sm. In the drive IC 110, ON/OFF operation of the main switch Sm is performed based on the charge voltage of the capacitor 80. The drive IC 110 includes a power source 90 that supplies electrical charge for turning the main switch Sm ON, and a charge switching element 92 for opening and closing a path between the drive IC 110 and an external charge resistor 94. The drive IC 110 also includes a discharge switching element 98 that opens and closes a path between a discharge resistor 96 connected to the gate of the main switch Sm and the output terminal of the main switch Sm. The drive IC 110 includes a switching circuit 100 that switches between turning ON the charge switching element 92 and turning OFF the discharge switching element 98, and turning OFF the charge switching element 92 and turning ON the discharge switching element 98, based on the charge voltage of the capacitor 80.

According to the first embodiment, the charge voltage of the capacitor 30 becoming zero is not directly detected to switch the main switch Sm to the ON state. Instead, with the timing for switching the sub-switch Ss to the ON state as a reference timing, a delay time from the reference timing to the timing at which the main switch Sm is switched to the ON state is controlled to a time at which the charge voltage of the capacitor 30 is expected to become zero. Therefore, to perform soft-switching, accurate control of the delay time is desired. However, the time difference (delay time) between the output timings of the operation signals gm and gs from the control device 52 and the timings at which the switching states of the main switch Sm and the sub-switch Ss are switched based on the operation signals gm and gs may vary depending on individual differences and the like of the interface 40 and the drive unit DU. The variation causes error in the delay time.

In addition, the variation leads to the soft-switching not being able to be appropriately performed. In other words, for example, when the main switch Sm is switched to the ON state before the capacitor 30 is completely discharged, because the switch to the ON state is not a favorable VZS, switching loss increases. Furthermore, when the main switch Sm is switched to the ON state at a timing later than the timing at which the capacitor 30 has been completely discharged (timing at which mode 5 is entered), the main switch Sm is switched to the ON state after charging of the capacitor 30 via the diode 28 has been started. Therefore, in this instance as well, the switch to the ON state is not a favorable ZVS, and switching loss increases.

Therefore, according to the first embodiment, a process is performed for detecting error in delay time during manufacturing of the control system, acquiring information for reducing the error, and storing the acquired information in the control device 52. In other words, in a state in which a signal transmission path shown in FIG. 4 (excluding the path further upstream than the photocoupler 60) is formed on a semiconductor substrate, transmission time for signals is measured, and the error in delay time is detected based on the measured transmission time. Then, correction data for the delay time calculated based on the detected error is stored in a storage device (a non-volatile memory within the control device 52: electrically erasable programmable read-only memory [EEPROM] 52a) regardless of whether the control device 52 is operating.

Figure 5A:
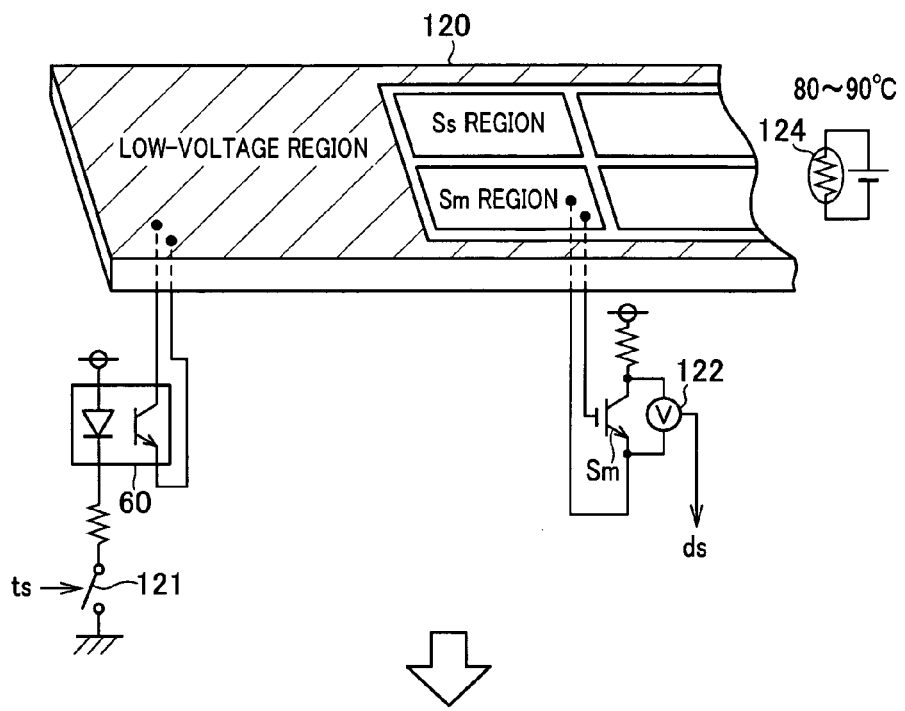
FIG. 5A and FIG. 5B are diagrams of a detection step for delay time and a storage step for correction information according to the first embodiment.
Figure 5B:
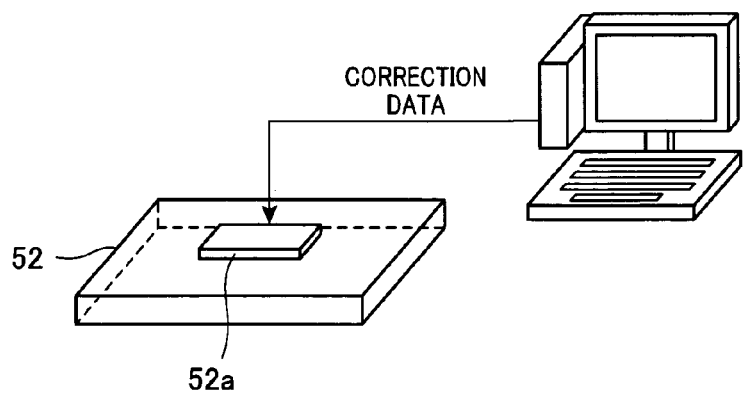

FIG. 5A and FIG. 5B show a process for storing the correction data according to the first embodiment. Here, first, as shown in FIG. 5A, the transmission time for the command to switch the main switch Sm to the ON state is measured. This is performed in a state in which the circuit shown in FIG. 4, excluding the section further upstream from the photocoupler 60, is formed on a semiconductor substrate 120. Specifically, according to the first embodiment, to perform measurement before the control device 52 is connected, a test switching element 121 simulating the low-voltage side switching element 66 is connected to the photocoupler 60, and a test signal Ts indicating the command for switching to the ON state is applied to the test switching element 121. Then, the voltage between the input and output terminals of the main switch Sm at this time is detected by a voltage sensor 122 as a detection signal ds. As a result, the time required until the main switch Sm is actually switched to the ON state is measured. When the converter CV is actually operating, because the main switch Sm is connected in parallel with the capacitor 30, the timing at which the main switch Sm switches to the ON state is difficult to detect from the voltage between the input and output terminals. Therefore, according to the first embodiment, the timing for switching is detected by voltage detection by connecting the power source and the resistor in series to the main switch Sm for a detection step. Because the timing for switching the sub-switch Ss to the ON state is required for measuring the delay timing, the transmission time of the signal until the sub-switch Ss is switched to the ON state is measured by a method similar to that described above, simultaneously with the above-described measuring process for the main switch Sm. As a result, the delay time from the timing at which the sub-switch is switched to the ON state to the timing at which the main switch Sm is switched to the ON state can be measured by correcting the delay time of the command for switching the main switch Sm to the ON state in relation to the command for switching the sub-switch Ss to the ON state based on a difference of the pair of measured transmission times, described above. Alternatively, a difference of the timings at which the main switch Sm and the sub-switch Ss are respectively actually switched to the ON state (delay time) may also be directly measured.

The detection step is performed with the temperatures of the semiconductor substrate 120 and the main switch Sm being set, by a heating process performed by a heater 124, to an upper limit temperature (for example, "80° C. to 90° C." in FIG. 5A) of temperatures estimated for when the converter CV is mounted in a vehicle and actually operated. The temperatures are set to minimize the error in delay time when the need to reduce heat generation by the main switch Sm as a result of soft-switching is the greatest.

When the detection step is completed as described above, the process proceeds to a storage step shown in FIG. 5B. At the storage step, the correction data based on the detected error is stored in the EEPROM 52a. The correction data enables the delay time of the command for switching the main switch Sm to the ON state in relation to the command for switching the sub-switch Ss to the ON state to be an amount of time suitable for the signal transmission device formed on the semiconductor substrate 120 to perform soft-switching. Here, the correction data is digital data.

Figure 6:
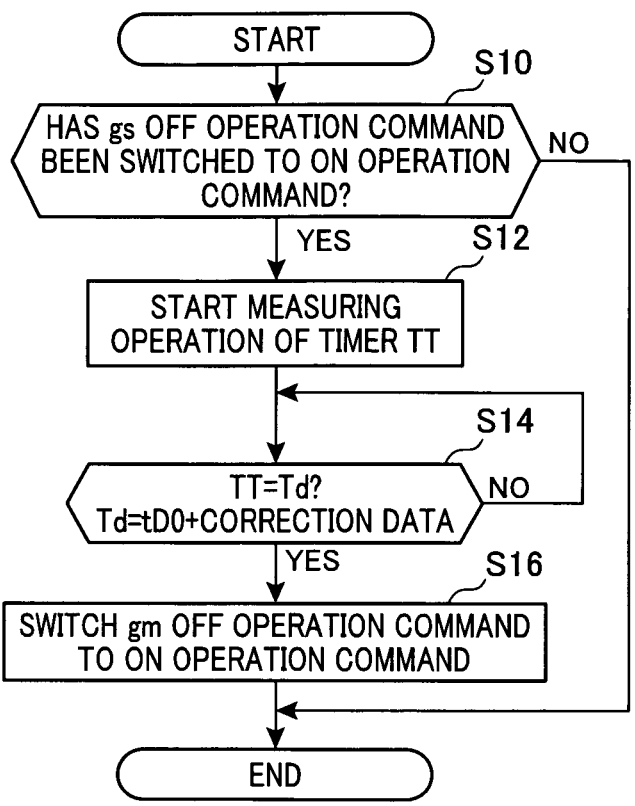
FIG. 6 is a flowchart of procedures in a correction process for delay time according to the first embodiment.

As a result, in the above-described control device 52 shown in FIG. 1, the delay time of the command for switching the main switch Sm to the ON state in relation to the command for switching the sub-switch Ss to the ON state is set by digital processing based on the correction data. FIG. 6 shows the procedures of the digital processing. The processes shown in FIG. 6 are repeatedly performed by the control device 52 at, for example, a predetermined interval.

In this series of processes, first at Step S10, the control device 52 judges whether or not the operation signal gs of the sub-switch Ss has switched from an OFF operation command to an ON operation command. Then, when judged YES at Step S10, at Step S12, the control device 52 starts the measuring operation of a timer TT that measures the time elapsed from the timing of the command for switching the sub-switch Ss to the ON state. Then, at Step S14, the control device 52 judges whether or not the timer TT has reached a delay time Td. The process is performed to judge whether or not it is time to switch the operation signal gm of the main switch Sm from the OFF operation command to the ON operation command. Here, the delay time Td is a value that is the sum of an initial value Td0 commonly stored in the mass-produced control devices 52 and the correction amount stored in the EEPROM 52a. When judged YES at Step S14, at Step S16, the control device 52 switches the operation signal gm of the main switch Sm from the OFF operation command to the ON operation command.

When judged NO at Step S10 and when the process at Step S16 is completed, the series of processes is temporarily completed.

According to the above-described first embodiment, the following effects can be achieved.

(1) During manufacturing of the signal transmission device of the converter CV, the error in delay time of the timing at which the main switch Sm is switched to the ON state in relation to the timing at which the sub-switch Ss is switched to the ON state is detected. The correction data for reducing the error is stored in the EEPROM 52a. As a result, controllability of soft-switching can be highly maintained.

(2) The correction data is stored in the control device 52 that generates the operation signal gm of the main switch Sm and the operation signal gs of the sub-switch Ss. As a result, a digital processing means for performing the correction process can be actualized by a hardware means within the control device 52.

(3) The error in delay time is detected based on detection of the timing at which the voltage between the input terminal and the output terminal of the main switch Sm changes in response to the command for switching the main switch Sm to the ON state. As a result, because the actual timing at which the main switch Sm is switched to the ON state is directly detected, the error in delay time can be detected with high accuracy.

(4) The main switch Sm is switched to the ON state at the timing at which the charge voltage of the capacitor 30 becomes the minimal value using a resonance phenomenon occurring between the capacitor 30 and the inductor 20. In this instance, because variations in the transmission time of the command for switching to the ON state are required to be reduced, the advantages of storing the correction data are particularly great.

(5) The detection step is performed at the higher temperatures of the temperatures estimated for actual use of the converter CV. As a result, power loss at high temperature can be reduced and excessive temperature rise can be prevented.

Second Embodiment

A second embodiment will hereinafter be described with reference to the drawings, focusing mainly on differences with the above-described first embodiment.

Figure 7A:
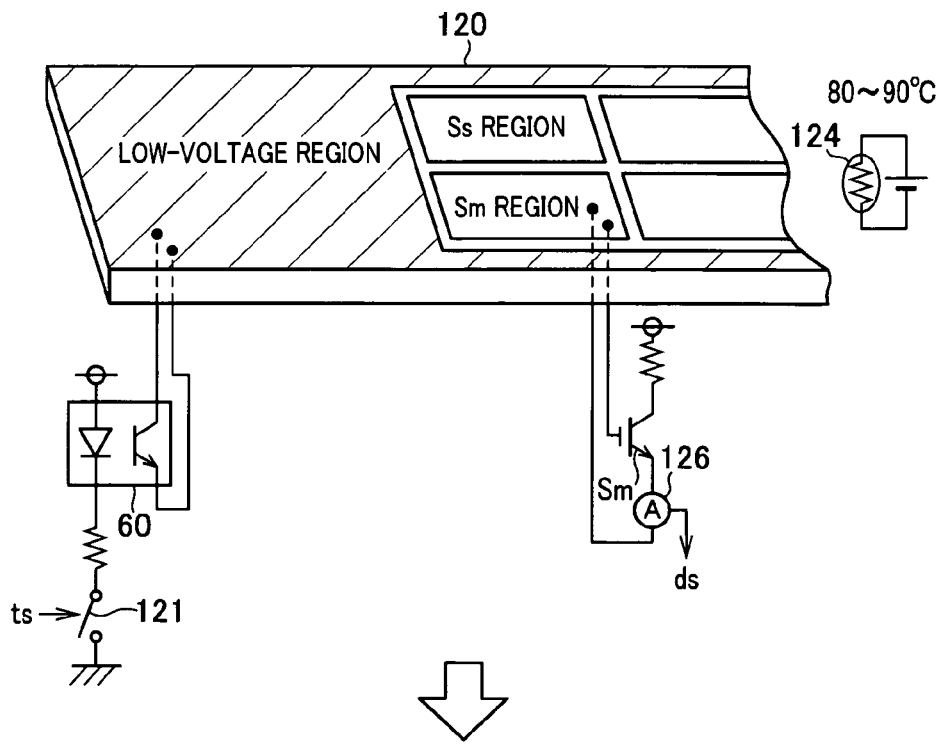
FIG. 7A and FIG. 7B are diagrams of a detection step for delay time and a storage step for correction information according to a second embodiment.
Figure 7B:
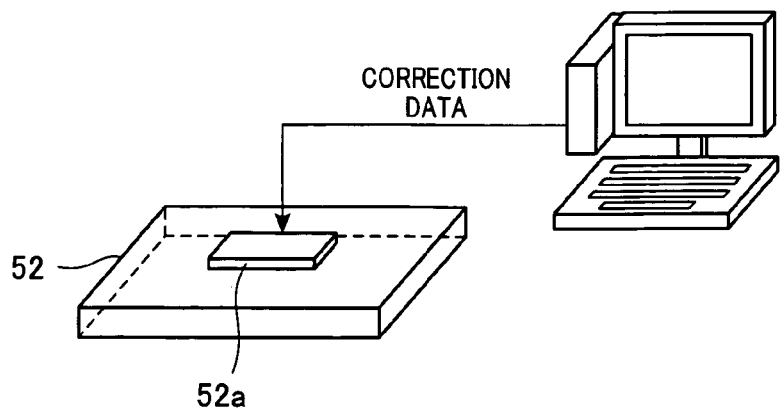

FIG. 7A and FIG. 7B show a process for storing correction data according to the second embodiment. Components in FIG. 7A and FIG. 7B that correspond to the components shown in FIG. 5A and FIG. 5B are given the same reference numbers for convenience.

According to the second embodiment, the timings at which the main switch Sm and the sub-switch Ss are switched to the ON state are detected as the timings at which the current begins to flow between the respective input terminals and output terminals of the switches. FIG. 7 shows an example of when a collector current flowing to the main switch Sm is detected by a current sensor 126, and the detection result is outputted as the detection signal ds.

According to the above-described second embodiment as well, effects similar to those according to the first embodiment can be achieved.

Third Embodiment

A third embodiment will hereinafter be described with reference to the drawings, focusing mainly on differences with the above-described first embodiment.

Figure 8A:
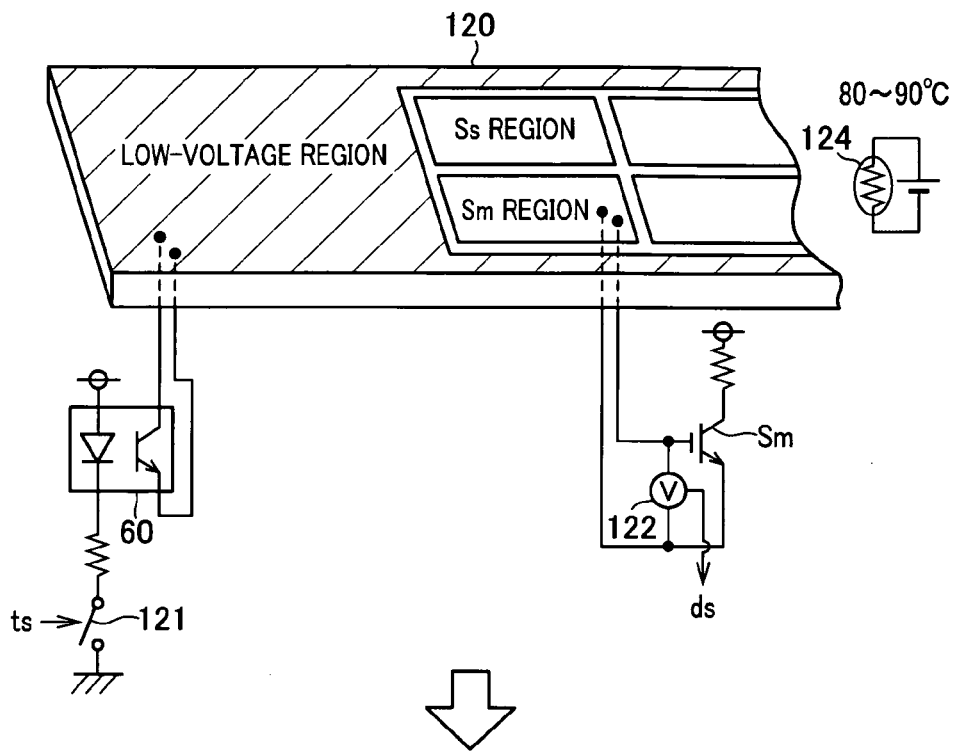
FIG. 8A and FIG. 8B are diagrams of a detection step for delay time and a storage step for correction information according to a third embodiment.
Figure 8B:
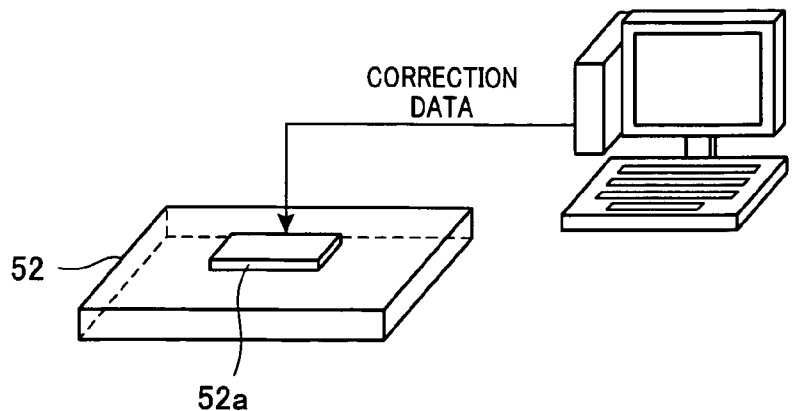

FIG. 8A and FIG. 8B show a process for storing correction data according to the third embodiment. Components in FIG. 8A and FIG. 8B that correspond to the components shown in FIG. 5A and FIG. 5B are given the same reference numbers for convenience.

According to the third embodiment, the timings at which the main switch Sm and the sub-switch Ss are switched to the ON state are detected as timings at which the voltage at the respective conduction control terminals of the switches (gate voltage Vge) becomes a threshold voltage or higher. FIG. 8A and FIG. 8B show an example of when the gate voltage Vge of the main switch Sm is detected by the voltage sensor 122, and the detection result is outputted as the detection signal ds. The threshold voltage is a voltage higher than that during a mirror period.

According to the above-described third embodiment as well, the effects (1), (2), (4), and (5) according to the first embodiment can be achieved.

Fourth Embodiment

A fourth embodiment will hereinafter be described with reference to the drawings, focusing mainly on differences with the above-described first embodiment.

Figure 9A:
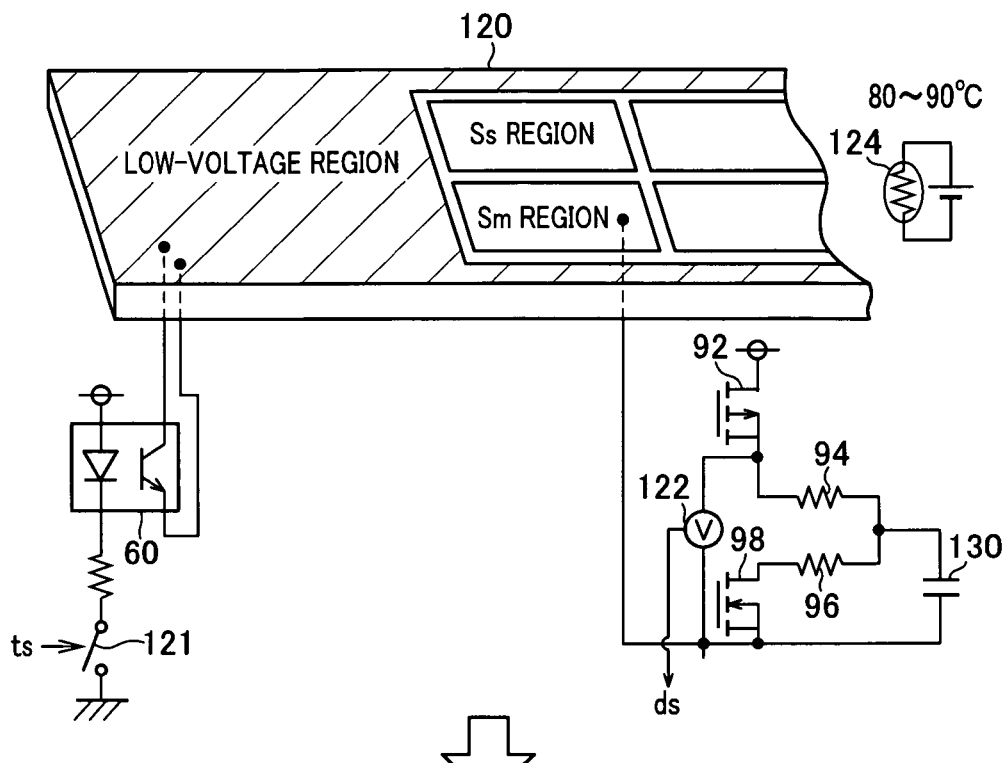
FIG. 9A and FIG. 9B are diagrams of a detection step for delay time and a storage step for correction information according to a fourth embodiment.
Figure 9B:
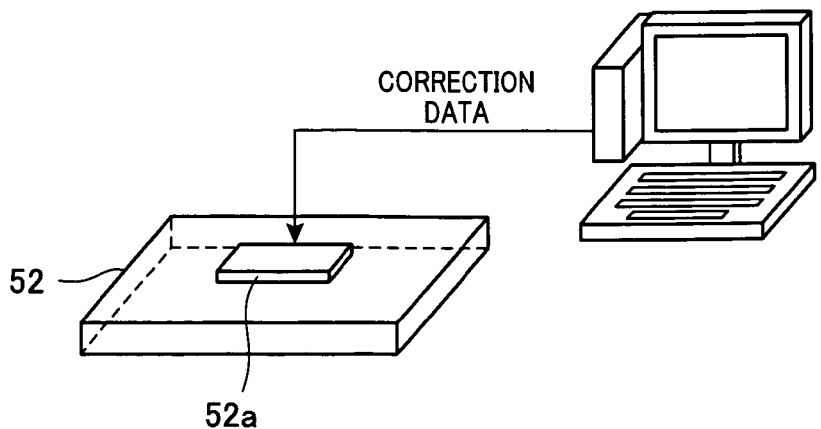

FIG. 9A and FIG. 9B show a process for storing correction data according to the fourth embodiment. Components in FIG. 9A and FIG. 9B that correspond to the components shown in FIG. 5A and FIG. 5B are given the same reference numbers for convenience.

According to the fourth embodiment, the timings at which the main switch Sm and the sub-switch Ss are switched to the ON state are detected as the timings at which the drive IC 110 is switched to operation in the ON state. FIG. 9A and FIG. 9B show an example of when the voltage between the output terminal of the charge switching element 92 of the main switch Sm and the output terminal of the main switch Sm is detected by the voltage sensor 122, and the detection result is outputted as the detection signal ds.

According to the fourth embodiment, because the detection step is performed when the main switch Sm is not connected, a capacitor 130 simulating the gate capacitance of the main switch Sm is connected between the charge resistor 94 and the discharge switching element 98.

According to the above-described fourth embodiment as well, the effects (1), (2), (4), and (5) according to the first embodiment can be achieved.

Fifth Embodiment

A fifth embodiment will hereinafter be described with reference to the drawings, focusing mainly on differences with the above-described first embodiment.

According to the first embodiment, an error $\Delta$ is detected by measuring the delay time itself from the timing at which the sub-switch Ss is switched to the ON state to the timing at which the main switch Sm is switched to the ON state. In this instance, the detection accuracy of the error $\Delta$ is dependent on how accurately the amount of time optimal as the delay time for performing soft-switching is determined. Here, the amount of time optimal as the delay time from the timing at which the sub-switch Ss is switched to the ON state to the timing at which the main switch Sm is switched to the ON state, in terms of performing soft-switching, is dependent on the circuit characteristics of the converter CV and the signal transmission device. Therefore, determining the optimal amount of time with high accuracy is difficult.

According to the fifth embodiment, power loss occurring when the main switch Sm is switched to the ON state is detected as a parameter correlated with the error $\Delta$. As a result, even when the optimal amount of time cannot be determined, the error $\Delta$ can be detected with high accuracy from the power loss.

Figure 10A:
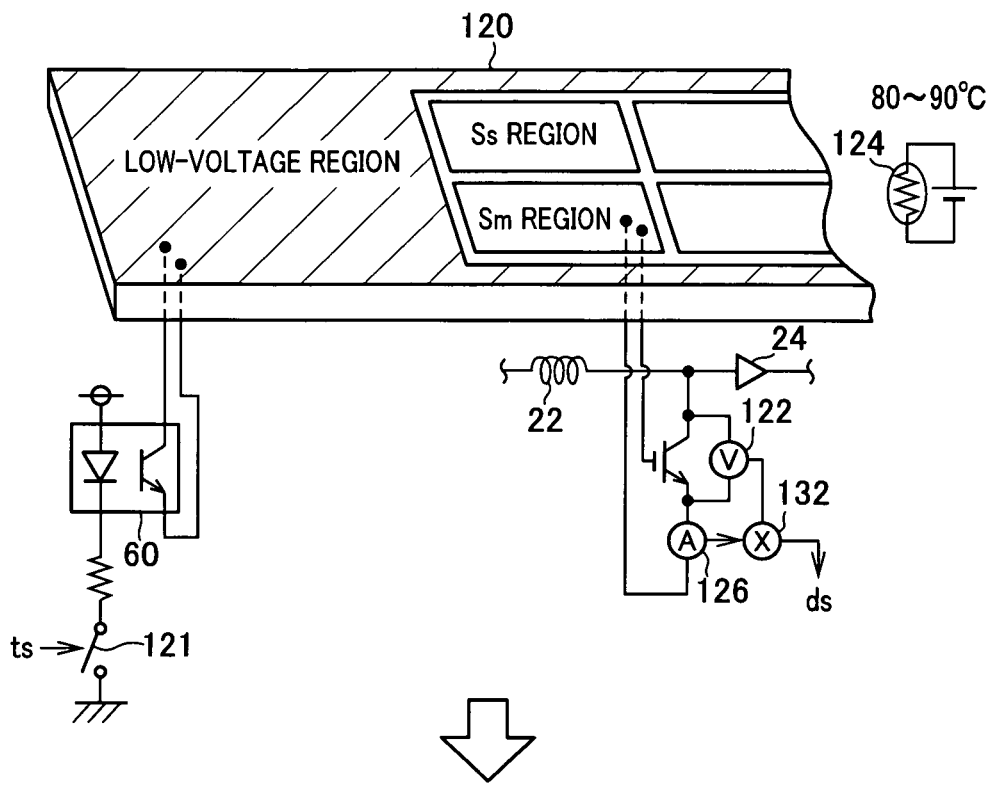
FIG. 10A and FIG. 10B are diagrams of a detection step for delay time and a storage step for correction information according to a fifth embodiment.
Figure 10B:
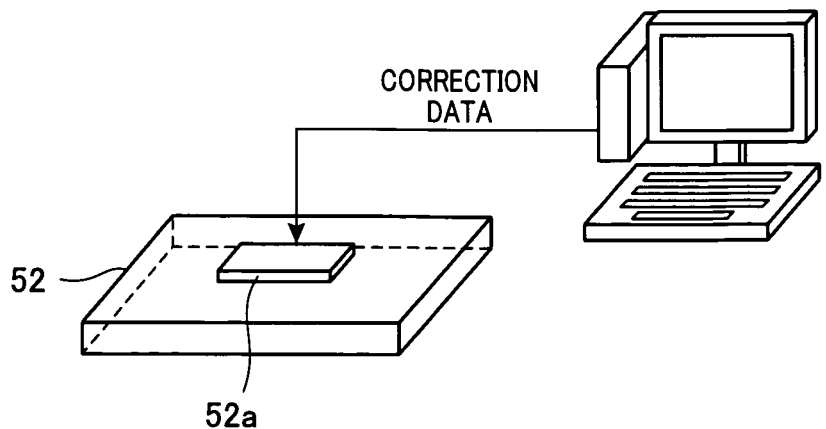

FIG. 10A and FIG. 10B shows a process for storing correction data according to the fifth embodiment. Components in FIG. 10A and FIG. 10B that correspond to the components shown in FIG. 5A and FIG. 5B are given the same reference numbers for convenience.

As shown in FIG. 10A, in a state in which the converter CV is configured, the voltage sensor 122 detects the voltage between the input terminal and the output terminal of the main switch Sm. The current sensor 126 detects the current flowing between the input terminal and the output terminal of the main switch Sm. Then, a multiplier 132 multiplies the detection value of the voltage and the detection value of the current, and outputs the result as the detection signal ds. A time integration value of the detection signal ds is the loss accompanying switching of the main switch Sm to the ON state. Therefore, the correction value for reducing loss is stored in the EEPROM 52a in the storage step shown in FIG. 10B.

According to the above-described fifth embodiment as well, in addition to the effects (1), (2), (4), and (5) according to the first embodiment, the following effect can be achieved.

(6) As a result of the power loss being detected as a parameter correlated with the error in actual delay time in relation to delay time, the error in actual delay time in relation to optimal delay time can be detected with high accuracy.

Sixth Embodiment

A sixth embodiment will hereinafter be described with reference to the drawings, focusing mainly on differences with the above-described first embodiment.

Figure 11:
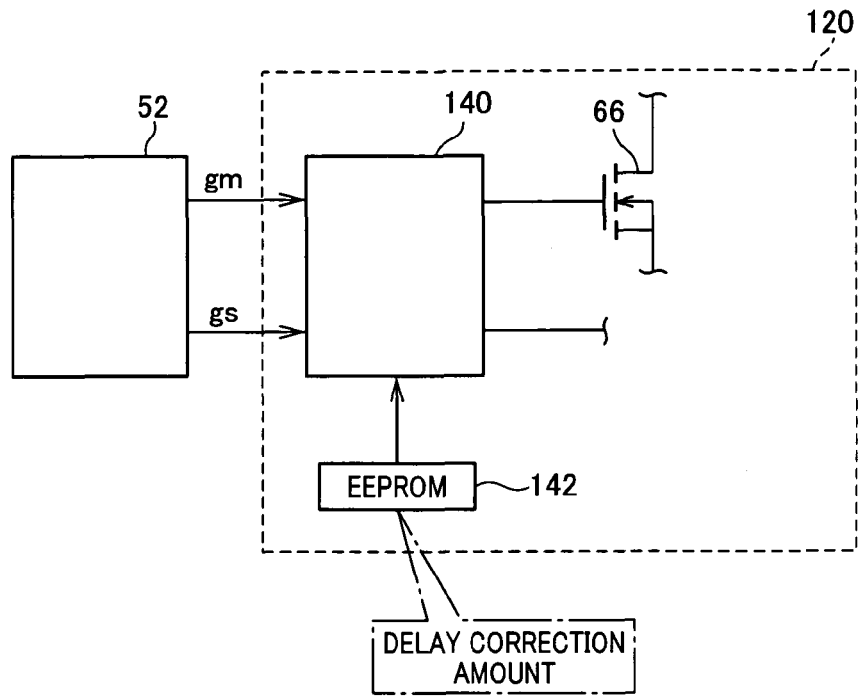
FIG. 11 is a diagram of a configuration for actualizing a correction process for delay time according to a sixth embodiment.

FIG. 11 shows a configuration of a means related to storage and use of correction data according to the sixth embodiment. Components in FIG. 11 that correspond to the components shown in FIG. 1 are given the same reference numbers for convenience.

As shown in FIG. 11, according to the sixth embodiment, the correction data is used by a low-voltage side drive circuit 140 that drives switching elements (low-voltage side switching element 66 and the like) for turning ON and OFF the photocoupler 60 on the semiconductor substrate 120. In other words, a storage device (EEPROM 142) that holds data regardless of the control device 52 being operated or stopped is provided on the semiconductor substrate 120. The low-voltage side drive circuit 140 stores a delay correction amount stored in the EEPROM 142. As a result, the low-voltage drive circuit 140 delays the timing at which the operation signal gs of the sub-switch Ss becomes the command for switching to the ON state by the delay correction amount. The low-voltage drive circuit 140 also delays the timing at which the operation signal gm of the main switch Sm becomes the command for switching to the ON state by the delay correction amount. As a result, the delay time of the timing at which the main switch Sm is switched to the ON state in relation to the timing at which the sub-switch Ss is switched to the ON state can be set to an amount of time optimal for soft switching.

Figure 12:
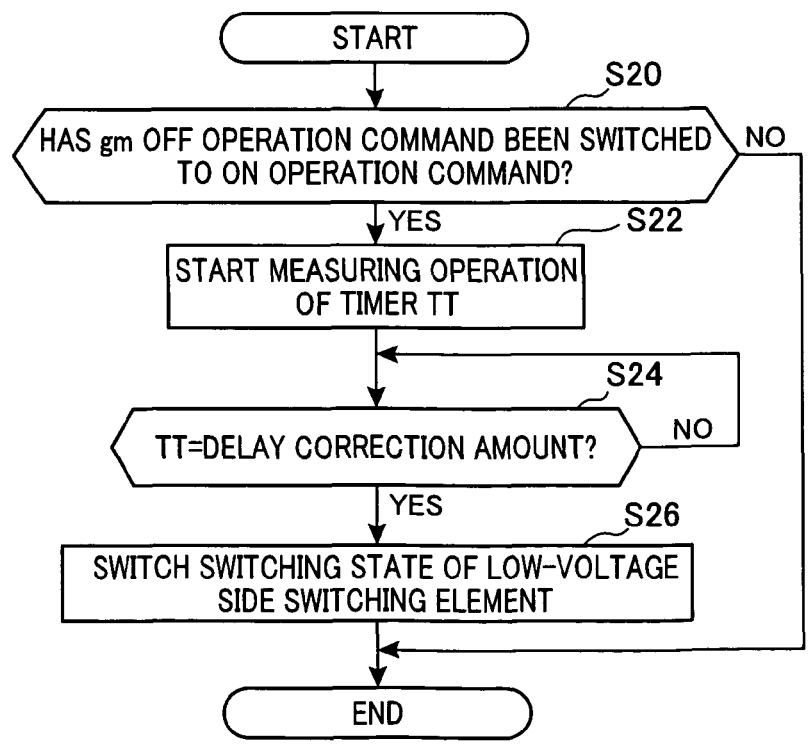
FIG. 12 is a flowchart of procedures in the correction process for delay time according to the sixth embodiment.

The low-voltage side drive circuit 140 is a hardware means capable of performing digital processing, and performs a process related to the delay correction based on digital data stored in the EEPROM 142. FIG. 12 shows a delay correction process performed by the low-voltage side drive circuit 140, and in particular, processes related to the main switch Sm. The processes are repeatedly performed, for example, at a predetermined interval.

In this series of processes, first at Step S20, the low-voltage side drive circuit 140 judges whether or not the operation signal gm of the main switch Sm has switched from the OFF operation command to the ON operation command. When judged that the operation signal gm has switched to the ON operation command, at Step S22, the low-voltage side drive circuit 140a starts the measuring operation of a timer TT that measures the time elapsed from the switching timing. Then, as a result of the timer TT reaching the delay correction amount stored in the EEPROM 142 (YES at Step S24), at Step S26, the low-voltage side drive circuit 140a switches the switching state of the low-voltage side switching element 66.

When judged NO at Step S20, and when the process at Step S26 is completed, the series of processes for this time is completed.

According to the above-described sixth embodiment as well, in addition to the effects (1), and (3) to (5) according to the first embodiment, the following effects can be achieved.

(7) A process for applying the correction data is performed in the low-voltage side drive circuit 140 formed on a substrate (semiconductor substrate 120) separate from the control device 52. As a result, the error in delay time attributed to variations in signal transmission time can be compensated using only a section that transmits the output signal of the control device 52. Therefore, a signal transmission device that favorably suppresses the error in delay time caused by variations in signal transmission time can be manufactured and provided, regardless of whether or not manufacturing of the control device 52 is completed.

(8) The correction data is the delay correction amount. Therefore, the timings of the command for switching the switching state of the operation signals gm and gs can be easily corrected such that the delay time of the timing at which the main switch Sm is switched to the ON state in relation to the timing at which the sub-switch Ss is switched to the ON state becomes an amount of time suitable for soft-switching.

Seventh Embodiment

A seventh embodiment will hereinafter be described with reference to the drawings, focusing mainly on differences with the above-described first embodiment.

Figures 13, 14:
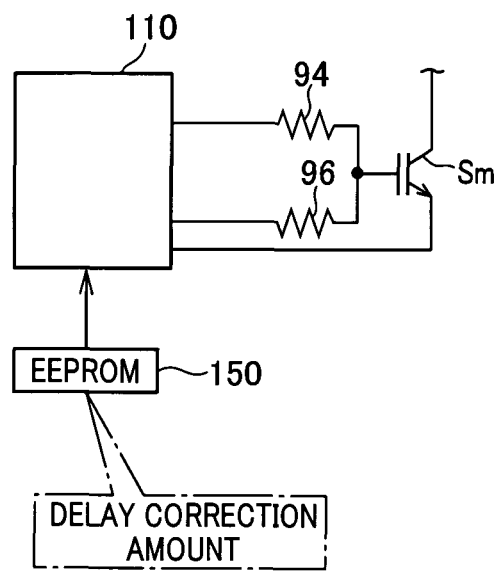
FIG. 13 is a diagram of a configuration for actualizing a correction process for delay time according to a seventh embodiment.
FIG. 14 is a diagram of a storage method for correction data according to an eighth embodiment.

FIG. 13 shows a configuration of a means related to storage and use of correction data according to the seventh embodiment. Components in FIG. 13 that correspond to the components shown in FIG. 1 are given the same reference numbers for convenience.

As shown in FIG. 13, according to the seventh embodiment, the correction data is used by the drive IC 110 formed on the semiconductor substrate 120. In other words, a storage device (EEPROM 150) that holds data regardless of the control device 52 being operated or stopped is provided on the semiconductor substrate 120. The drive IC 110 stores a delay correction amount stored in the EEPROM 150. As a result, the drive IC 110 delays the timing at which the operation signal gs of the sub-switch Ss becomes the command for switching to the ON state by the delay correction amount. The low-voltage drive circuit 140 also delays the timing at which the operation signal gm of the main switch Sm becomes the command for switching to the ON state by the delay correction amount. As a result, the delay time of the timing at which the main switch Sm is switched to the ON state in relation to the timing at which the sub-switch Ss is switched to the ON state can be set to an amount of time optimal for soft switching.

The drive IC 110 is a hardware means capable of performing digital processing, and performs a process related to the delay correction based on digital data stored in the EEPROM 150.

According to the above-described seventh embodiment as well, effects similar to those according to the sixth embodiment can be achieved.

Eighth Embodiment

An eighth embodiment will hereinafter be described with reference to the drawings, focusing mainly on differences with the above-described first embodiment.

FIG. 14 shows a storage method for correction data according to the eighth embodiment. As shown in FIG. 14, according to the eighth embodiment, pieces of correction data are individually stored in each of a plurality of areas divided according to temperature. The correction data is stored as such in light of the circuit characteristics of the transmission paths of the operation signals gm and gs changing depending on temperature. In addition, a value suitable for the delay time of the timing of the command for switching the main switch Sm to the ON state in relation to the timing of the command for switching the sub-switch Ss to the ON state changes as a result of temperature dependency of the circuit characteristics of the converter CV.

According to the above-described eighth embodiment as well, in addition to the effects (1) to (5) according to the first embodiment, the following effects can be achieved.

(8) As a result of the pieces of correction data being individually stored in the plurality of temperature regions, even when the transmission path of the command for switching the switching state and the circuit characteristics of the converter CV change depending on the temperature, the error in delay time can be appropriately reduced.

<Modifications>

Each of the above-described embodiments may be modified as follows.

[Regarding Storage Means]

The storage means is not limited to the EEPROM and may be, for example, a read-only memory (ROM).

[Regarding Correcting Means]

A correcting means is not limited to those given according to the above-described embodiments. For example, a means for delaying signals outputted from a secondary side of the photocoupler 60 may be provided between the secondary side of the photocoupler and the drive IC 110, and the delay amount of the means may be adjustable depending on the correction data.

[Regarding Operation Signal Generating Means]

An operation signal generating means is not limited to that mounted in the low-voltage system.

[Regarding Semiconductor Substrate on which Drive Circuit is Formed]

The low-voltage switching element 66 may be formed on the semiconductor substrate 120 on which the drive circuit is formed. The operation signal generating means (control device 52) may also be formed on the semiconductor substrate 120. Alternatively, the photocoupler 60 may be formed on a substrate (substrate on which the control device 52 is formed) other than the semiconductor substrate 120.

[Regarding Detecting Step]

Figure 15A:
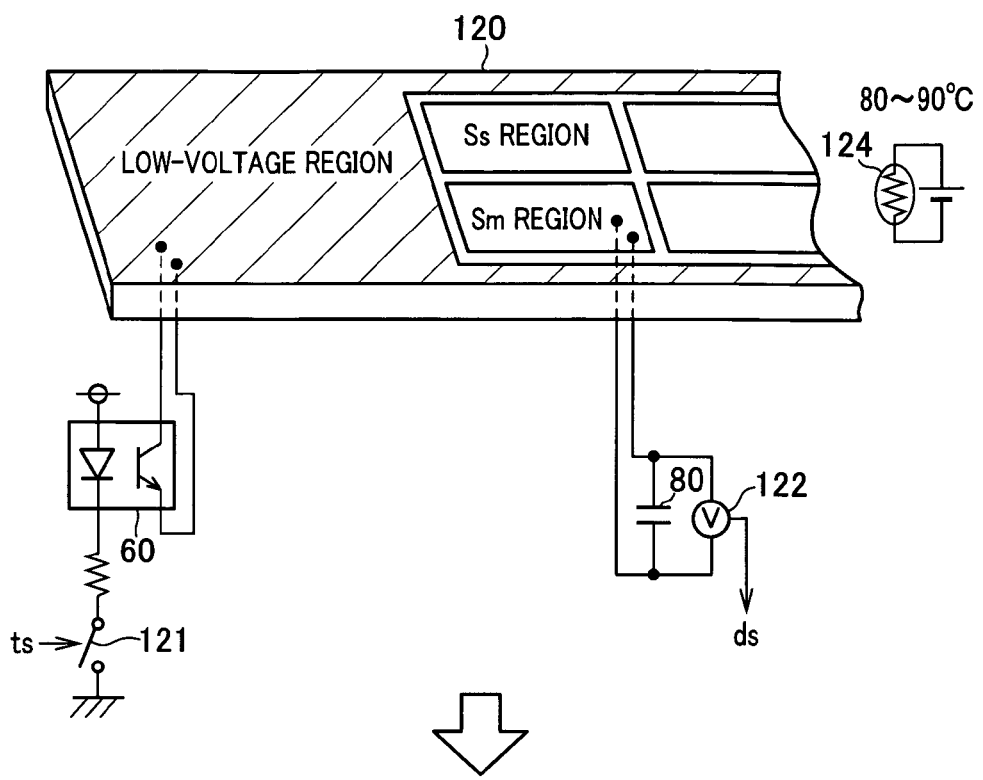
FIG. 15A and FIG. 15B are diagrams of a detection step for delay time and a storage step for correction information according to a variation example of the embodiments.
Figure 15B:
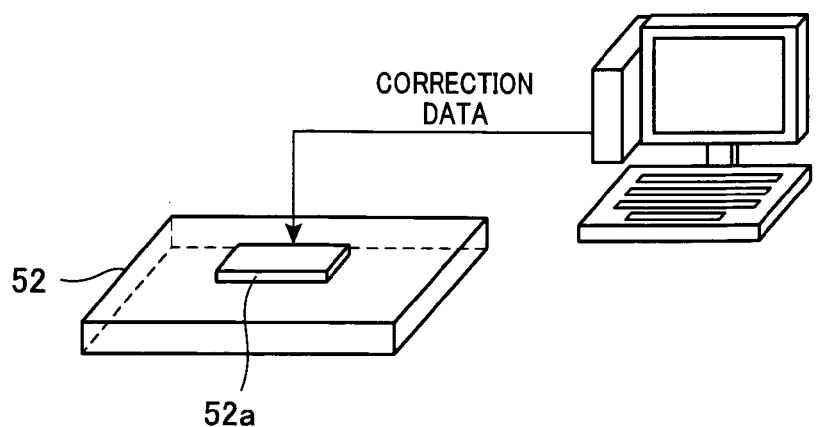

The detecting step for the error in delay time based on the transmission time to the main switch Sm and the sub-switch Ss of the command for switching the switching state is not limited to those described above. For example, as shown in FIG. 15A and FIG. 15B, the error in delay time may be detected based on the amount of time required for the switching command to be transmitted to the input terminal (capacitor 80) of the drive unit DU. In this instance as well, the error in delay time can be detected with high accuracy, for example, when the variations in signal transmission time in the drive unit DU can be ignored or the like. Such circumstances are easily actualized by, for example, the drive IC of the sub-switch Ss and the drive IC of the main switch Sm being configured on the same semiconductor substrate as a high-voltage integrated chip (HVIC). A reason for this is that variations in the amount of time required for respective switching commands of the sub-switch Ss and the main switch Sm to be transmitted within the drive IC can be reduced.

Figure 16A:
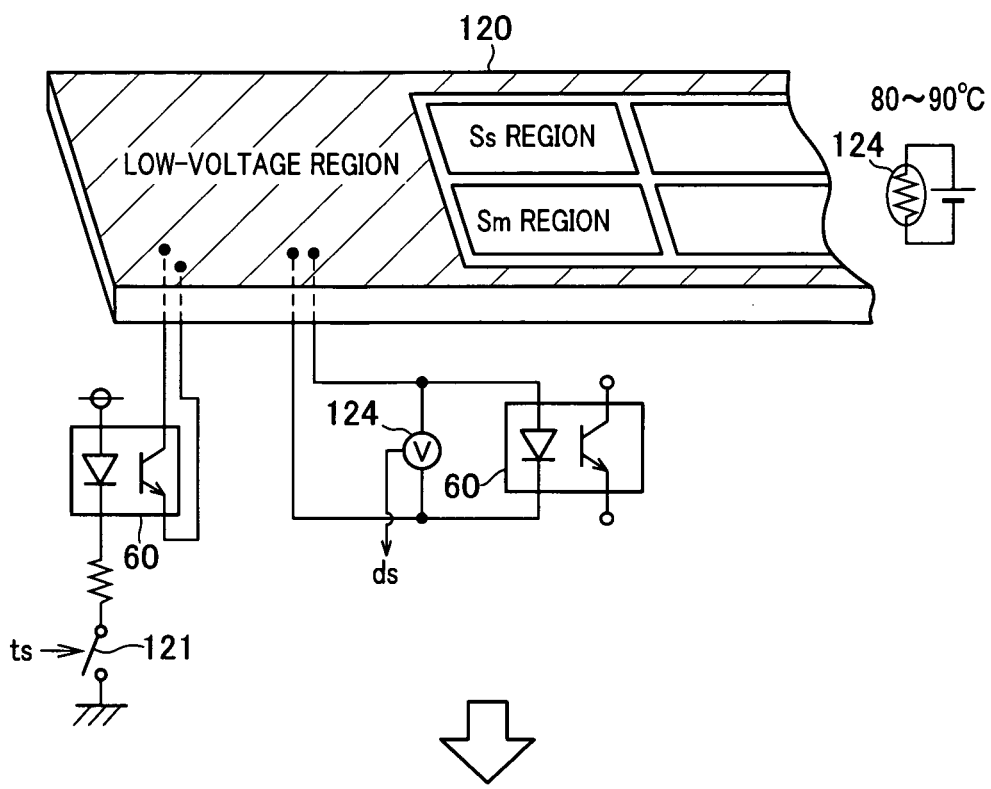
FIG. 16A and FIG. 16B are diagrams of a detection step for delay time and a storage step for correction information according to a variation example of the embodiments.
Figure 16B:
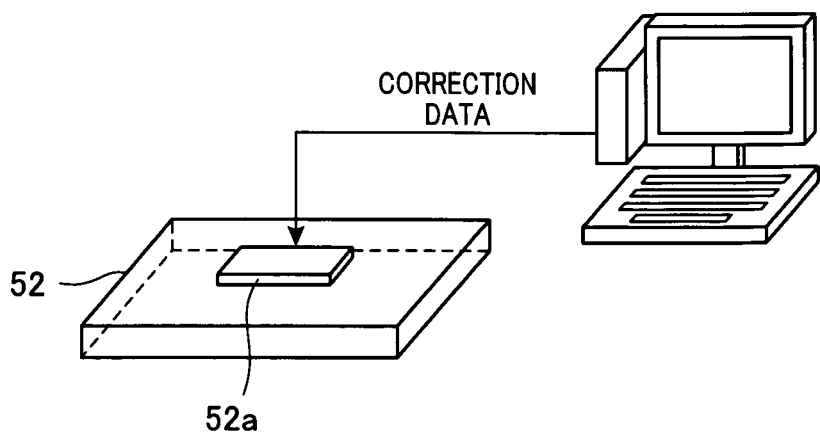
Figure 17A:
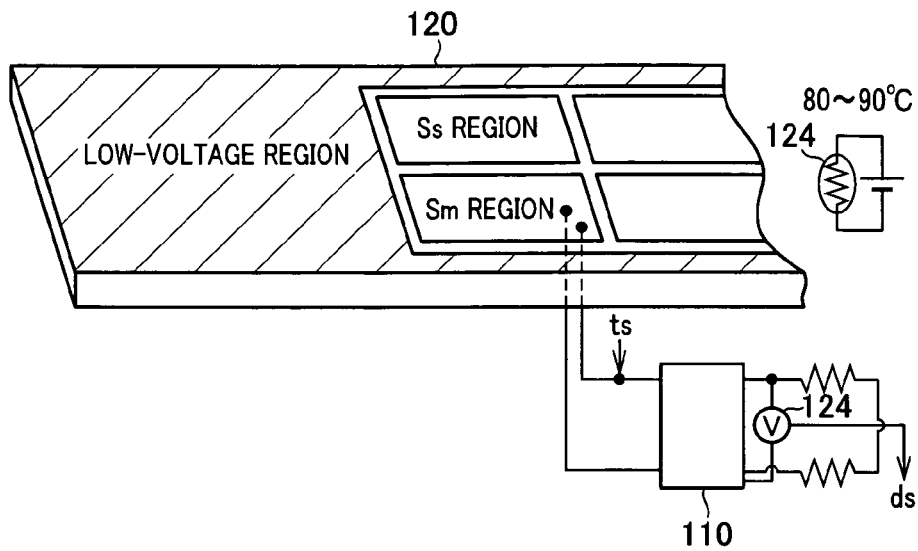
FIG. 17A and FIG. 17B are diagrams of a detection step for delay time and a storage step for correction information according to a variation example of the embodiments.
Figure 17A:
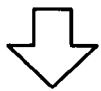
Figure 17B:
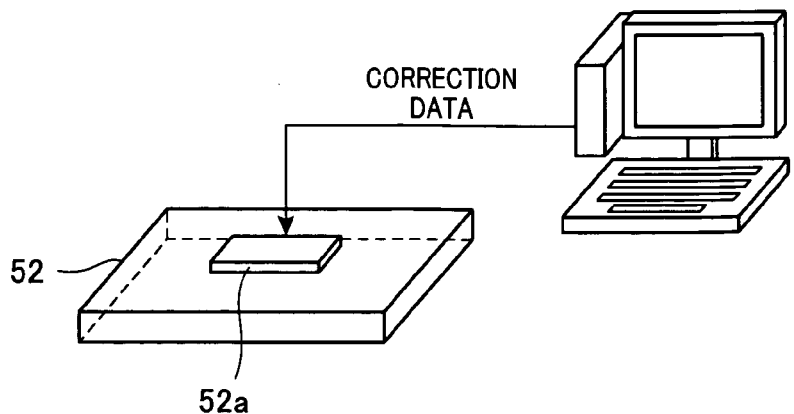

In addition, for example, as shown in FIG. 16A and FIG. 16B, the error in delay time may be detected based on the amount of time required for the switching command to be transmitted to a primary side of the photocoupler 60. Furthermore, as shown in FIG. 17A and FIG. 17B, the error in delay time may be detected based on the amount of time required until the test signal is that has been inputted into the drive circuit 110 is outputted from the drive IC 110. This method is effective under conditions in which the error in delay time is assumed to occur mainly in the drive IC 110.

Although error detection is performed in a state in which the main switch Sm and the sub-switch Ss are not yet connected in FIG. 15A to FIG. 17B, the switches may be connected.

[Power Conversion Circuit Performing Soft-Switching]

The power conversion circuit performing soft-switching is not limited to that shown in FIG. 1 and the like. For example, the power conversion circuit may be that described in JP-A-2009-213215. JP-A-2009-213215 describes that a switching state is switched from an OFF state to an ON state when current becomes zero. However, when switching is performed at high speed, the time at which the current becomes zero is difficult to detect without delay. Therefore, the soft-switching method may be changed to that in which an extrema of the current flowing in the reverse direction after the current gradually decreases and becomes zero is detected, and the switching state is switched to the ON state based on the delay time from the detection timing. In this instance, the present invention can effectively applied to control the delay time from the detection timing (reference timing) with high accuracy.

[Others]

The insulating means is not limited to the photocoupler 60 and may, for example, be a photoMOS relay. The insulating means is not limited to an optical insulating element and may, for example, be an electromagnetic insulating element, such as a transformer.

According to the above-described embodiments, the reference timing is the timing at which the sub-switch Ss is switched to the ON state, and the delay time of the timing at which the main switch Sm is switched to the ON state is controlled. However, this is not limited thereto. For example, a means for detecting voltage of the capacitor 30 may be included. With the timing at which the voltage of the capacitor 30 drops to a prescribed voltage (>0) as a reference timing, the delay time of the timing at which the main switch Sm is switched to the ON state may be controlled.

The switching element to be driven is not limited to the IGBT and may, for example, be a field-effect transistor, such as a power-MOS field-effect transistor.

The power conversion circuit is not limited to that which supplies power to the vehicle main engine and may, for example, be used to supply power to an electrical motor mounted in a vehicle power steering.

What is claimed is:

1. A soft-switching control device comprising:
a main switching element included in a power conversion circuit, the main switching element being switched on and off selectively for power conversion;
first control means for controlling the main switching element such that the main switching element is switched on, based on soft-switching control, in response to a first operation signal produced with a delay time;
a circuit comprising:
a sub switching element selectively switched on and off in response to a second operation signal, the delay time being assigned to an interval from a reference timing to a timing at which the main switching element is switched on, and
second control means for controlling a switching state of the sub switching element by the second operation signal;
a storage means for previously storing a delay correction amount for correcting error in the delay time, wherein the storage means stores the delay correction amount separately for each of a plurality of temperature ranges divided based on temperature of the power conversion circuit; and
a correcting means for correcting the delay time based on the delay correction amount.

2. The soft-switching control device according to claim 1, wherein the reference timing is a timing at which the sub switching element is switched on by the second operation signal.

3. The soft-switching control device according to claim 2, wherein
the correcting means generates a logical reverse timing of the first operation signal based on the information stored by the storage means.

4. The soft-switching control device according to claim 2, wherein
the correcting means uses the first operation signal as an input signal, corrects a logical reverse timing of the first operation signal based on the delay correction amount stored by the storage means, and outputs the corrected first operation signal to a drive circuit which drives the main switching element, and
the correcting means and the drive circuit are formed on a same semiconductor substrate that is a substrate separate from a semiconductor substrate on which the operation signal generating means is formed.

5. The soft-switching control device according to claim 1, wherein
the power conversion circuit is mounted in a high-voltage system insulated from a low-voltage system; and
the first control means includes an operation signal generating means mounted in the low-voltage system and is for generating the first operation signal, an insulating means for transmitting the first operation signal to the high-voltage system, and a drive circuit for driving the main switching element based on the first operation signal transmitted via the insulating means.

6. The soft-switching control device according to claim 5, wherein:
the operation signal generating means is mounted in the low-voltage system; and
the drive circuit is mounted in the high-voltage system; and
the correcting means corrects a logical reverse timing of the first operation signal in the drive circuit based on the delay correction amount stored by the storage means.

7. The soft-switching control device according to claim 1, wherein:
the power conversion circuit includes a capacitor and an inductor, the capacitor being electrically connected in parallel between an input terminal and an output terminal of the main switching element; and
the first control means is configured to perform the soft-switching control by switching on the main switching element in a state in which the capacitor is discharged using a resonance phenomenon occurring between the capacitor and the inductor.

8. A method of manufacturing a soft-switching control device,
wherein the soft-switching control device comprises:
a main switching element included in a power conversion circuit, the main switching element being switched on and off selectively for power conversion;
first control means for controlling the main switching element such that the main switching element is switched on, through soft-switching control, in response to a first operation signal produced with a delay time,
a circuit comprising:
a sub switching element selectively switched on and off in response to a second operation signal, the delay time being assigned to an interval from a reference timing to a timing at which the main switching element is switched on, and
second control means for controlling a switching state of the sub switching element by the second operation signal,
a storage means for previously storing a delay correction amount for correcting error in the delay time, wherein the storage means stores the delay correction amount separately for each of a plurality of temperature ranges divided based on temperature of the power conversion circuit; and
a correcting means for correcting the delay time based on the delay correction amount;
the method comprising:
a detecting step of detecting the error in delay time by transmitting a command for switching the switching state to the switching element; and
a storage step of generating the delay time amount based on the error in delay time detected at the detecting step and storing the generated delay time amount in the storage means.

9. The method of manufacturing a soft-switching control device according to claim 8, wherein:
the power conversion circuit is mounted in a high-voltage system insulated from a low-voltage system;
the soft-switching control device includes an operation signal generating means mounted in the low-voltage system and is for generating the first operation signal of the main switching element, an insulating means for transmitting the first operation signal to the high-voltage system, and a drive circuit for driving the main switching element based on the first operation signal transmitted via the insulating means; and
the detecting step detects the error in delay time based on detection of a timing at which the command arrives on an input side of the insulating means.

10. The method of manufacturing a soft-switching control device according to claim 9, wherein the detecting step is performed in a state in which the main switching element is not connected to the drive circuit.

11. The method of manufacturing a soft-switching control device according to claim 9, wherein, at the detecting step, the command is inputted in the insulating means.

12. The method of manufacturing a soft-switching control device according to claim 8, wherein:
the power conversion circuit is mounted in a high-voltage system insulated from a low-voltage system;
the soft switching control device includes an operation signal generating means mounted in the low-voltage system and is for generating the first operation signal of the main switching element, an insulating means for transmitting the first operation signal to the high-voltage system, and a drive circuit for driving the main switching element based on the first operation signal transmitted via the insulating means; and
the detecting step detects the error in delay time based on detection of a timing at which the command is reflected in an operation of the drive circuit.

13. The method of manufacturing a soft-switching control device according to claim 8, wherein:
the switching element is a voltage-control-type switching element; and
the detecting step detects the error in delay time by detecting a timing at which the command is reflected in a voltage at a conduction control terminal of the main switching element.

14. The method of manufacturing a soft-switching control device according to claim 8, wherein the detecting step detects the error in delay time by detecting a timing at which voltage between an input terminal and an output terminal of the main switching element changes in adherence to the command.

15. The method of manufacturing a soft-switching control device according to claim 8, wherein the detecting step detects the error in delay time based on detection of a timing at which current flowing through the main switching element changes in adherence to the command.

16. The method of manufacturing a soft-switching control device according to claim 8, wherein
- the power conversion circuit is mounted in a high-voltage system insulated from a low-voltage system; and
- the soft-switching control device includes an operation signal generating means for generating the first operation signal of the main switching element mounted in the low-voltage system, an insulating means for transmitting the first operation signal to the high-voltage system, and a drive circuit for driving the main switching element based on the first operation signal transmitted via the insulating means; and
- the detecting step detects the error in delay time based on detection of an amount of time from when the command is inputted in the drive circuit until the drive circuit operates based on the inputted command.

17. The method of manufacturing a soft-switching control device according to claim 8, wherein the detecting step detects the error in delay time based on power loss occurring when the switching state of the switching element is switched in adherence to the command.

18. The method of manufacturing a soft-switching control device according to claim 8,
wherein
- the detecting step is performed at higher temperatures than temperatures estimated for actual use of the power conversion circuit.

* * * * *